United States Patent [19]

Schoerner et al.

[11] Patent Number: 6,117,751

[45] Date of Patent: *Sep. 12, 2000

[54] METHOD FOR MANUFACTURING A MIS STRUCTURE ON SILICON CARBIDE (SIC)

[75] Inventors: Reinhold Schoerner, Grossenseebach; Peter Friedrichs, Nuremberg, both of Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/896,439

[22] Filed: Jul. 18, 1997

[30] Foreign Application Priority Data

Jul. 19, 1996 [DE] Germany .......................... 196 29 267

[51] Int. Cl.[7] .............................. H01L 21/20; H01L 21/36

[52] U.S. Cl. .......................... 438/482; 438/486; 438/657; 438/584; 438/586; 438/931

[58] Field of Search ..................................... 438/931, 486, 438/657, 684, 584, 586

[56] References Cited

U.S. PATENT DOCUMENTS

| | | |
|---|---|---|
| 4,479,831 | 10/1984 | Sandow et al. . |
| 5,147,826 | 9/1992 | Liu et al. . |
| 5,242,855 | 9/1993 | Oguro . |
| 5,470,780 | 11/1995 | Shishiguchi . |
| 5,714,415 | 2/1998 | Oguro . |
| 5,869,389 | 2/1999 | Ping et al. . |

OTHER PUBLICATIONS

Coaianu et al, "On the Electrical Conduction in the Interpolysilicon Dielectric Layers," IEEE Electron Device Letters, vol. 14, No. 5, pp. 213–215, 1993.

Schravendijk et al, "Thin Base Formation by Double Diffused Polysilicon Technology," IEEE 1988 Bipolar Circuits and Technology Meeting, Paper 6.6, pp. 132–135, 1988.

Wolf, Silicon Processing for the VLSI Era vol. 2–Process Integration, pp. 319–320, 1990.

Wolf, Silicon Processing for the VLSI Era vol. 1–Process Technology pp. 223–224, 1989 von Kamienski et al., "Long term stability of gate–oxides on n–and p–type silicon carbide studied by charge injection techniques", Materials Science & Engineering B, pp. 263–266.

Park et al., "Reliability Improvement of Thin Oxide by Double Deposition Process of Silicon Using Chemical Vapor Deposition", J. Appl. Phys. vol. 33 (1994) pp. L921–L922.

Pan, J.N. et al.: "Self–Aligned 6H–SiC Mosfets With Improved Current Drive," in *Electronics Letters*, Jul. 6, 1995, vol. 31, No. 14, pp. 1200–1201.

(List continued on next page.)

Primary Examiner—John F. Niebling
Assistant Examiner—Jonathan Hack
Attorney, Agent, or Firm—Hill & Simpson

[57] ABSTRACT

A method for producing a MIS structure on silicon carbide is provided. Given application of a known CVD method for occupying the surface of a SiC substrate provided with a gate oxide with the silicon serving as gate material, stationary positive charges arise in the region of the oxide/SiC boundary surface whose extremely high effective density ($Q_{tot} > 10^{12}$ cm$^{-2}$) disadvantageously influences the electrical properties of the finished component. The present method modifies the deposition conditions for the silicon serving as a gate material. Thus, the silicon is deposited from the vapor phase at a temperature of T<580° C. and is thus amorphously applied. During the subsequent doping (drive-in of phosphorous at T>800° C.), the amorphous silicon converts into the polycrystalline condition. Since the crystalline regions in the silicon layer can grow comparatively unimpeded and free of mechanical stresses, the effective density of the negative boundary surface charges arising in the gate oxide lies at values $Q_{tot} < 10^{11}$ cm$^{-2}$. The method is particularly applied in the manufacture of MOSFETs, MOS capacitors and the like.

7 Claims, 5 Drawing Sheets

OTHER PUBLICATIONS

Palmour, J.W. et al.: "High–Temperature Depletion–Mode Metal–Oxide–Semiconductor Field–Effect Transistors in Beta Si–C Thin Films," in *Appl. Phys. Lett.*, No. 51, Dec. 14, 1987, pp. 2028–2030.

Palmour, J.W. et al.: "Semiconductor Field–Effect Transistors in β–SiC Thin Films," in *J. Appl. Phys*, Aug. 15, 1988, pp. 2168–2177.

Xie, W. et al.: "The Effect of Thermal Processing on Polycrystalline Silicon/$SiO_2$/6H–SiC Metal–Oxide–Semiconductor Devices," *Appl. Phys. Lett.*, Apr. 15, 1996, pp. 2231–2233.

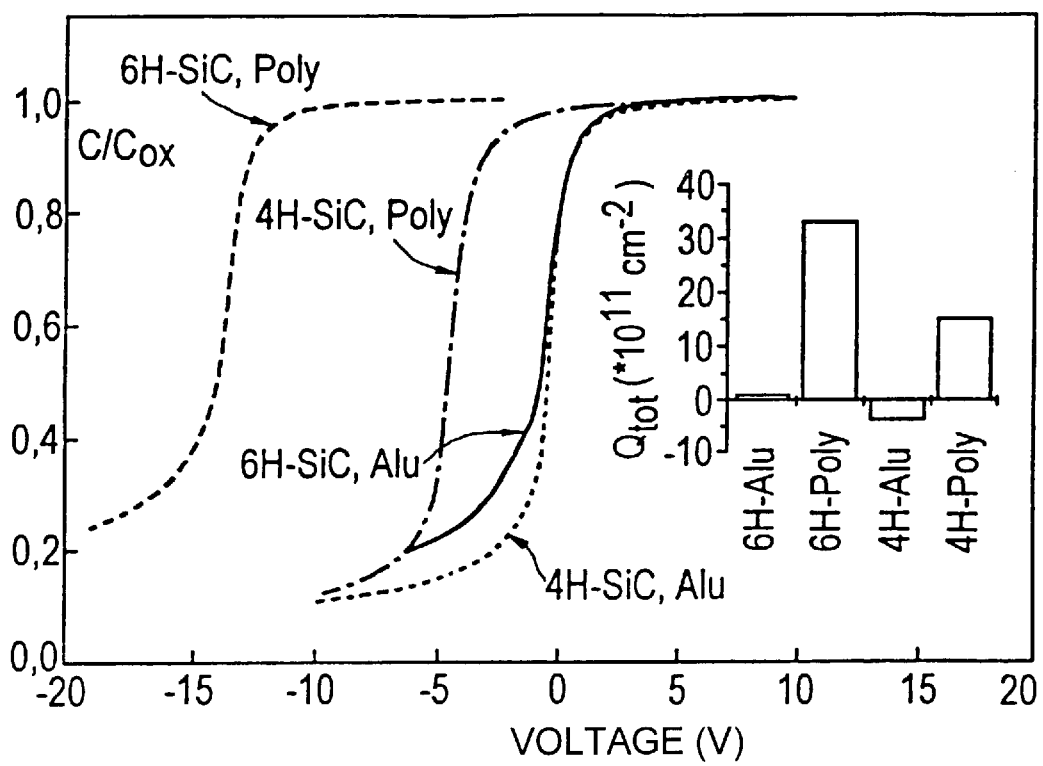
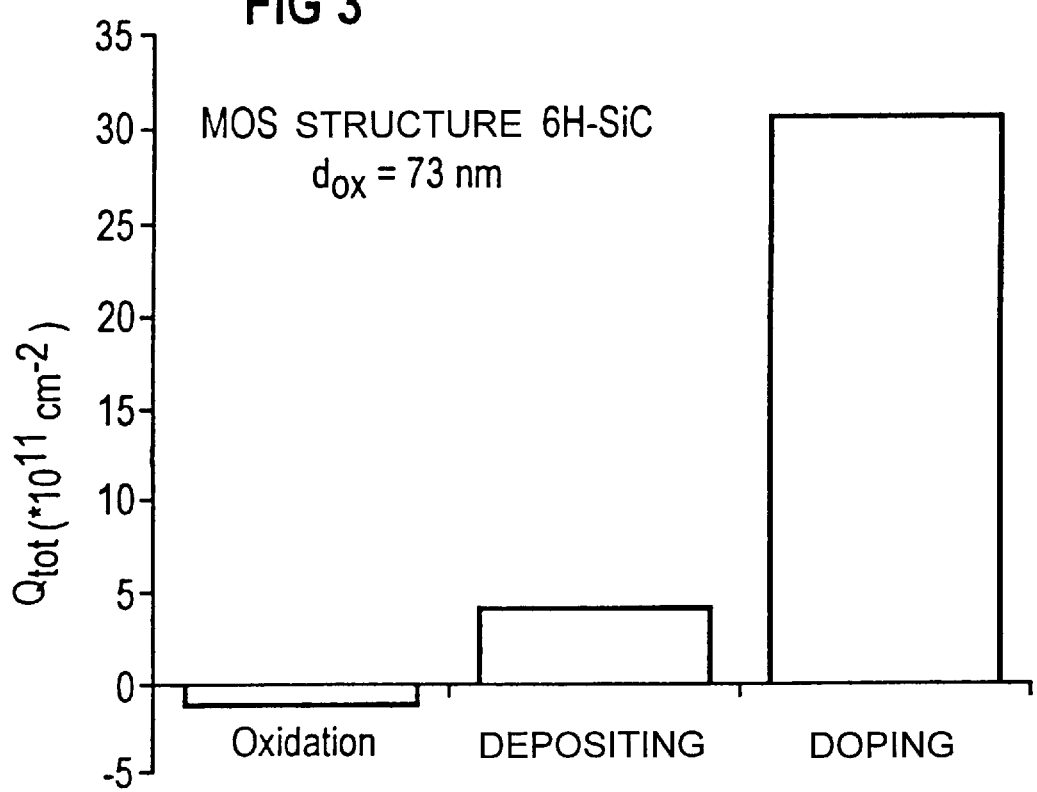

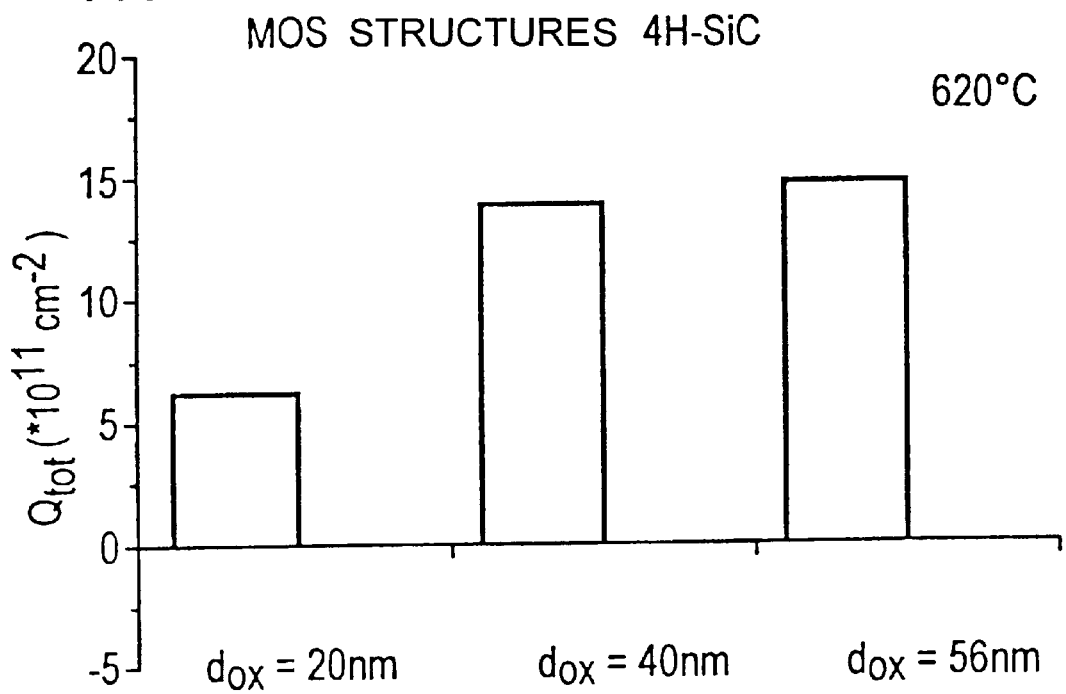
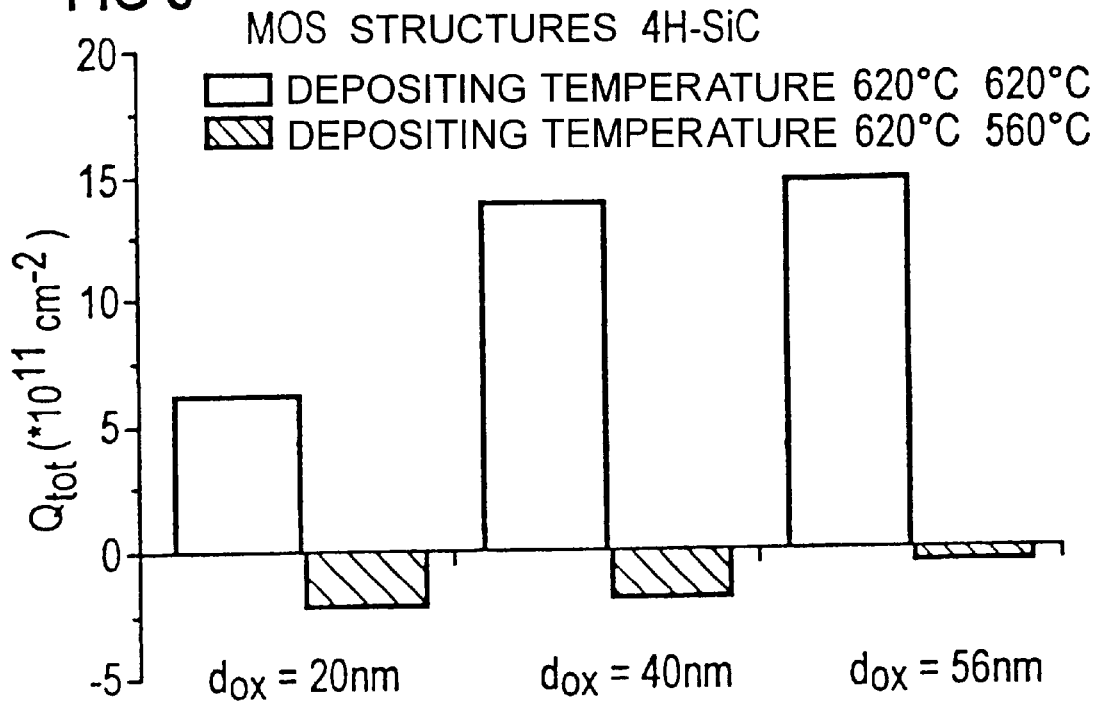

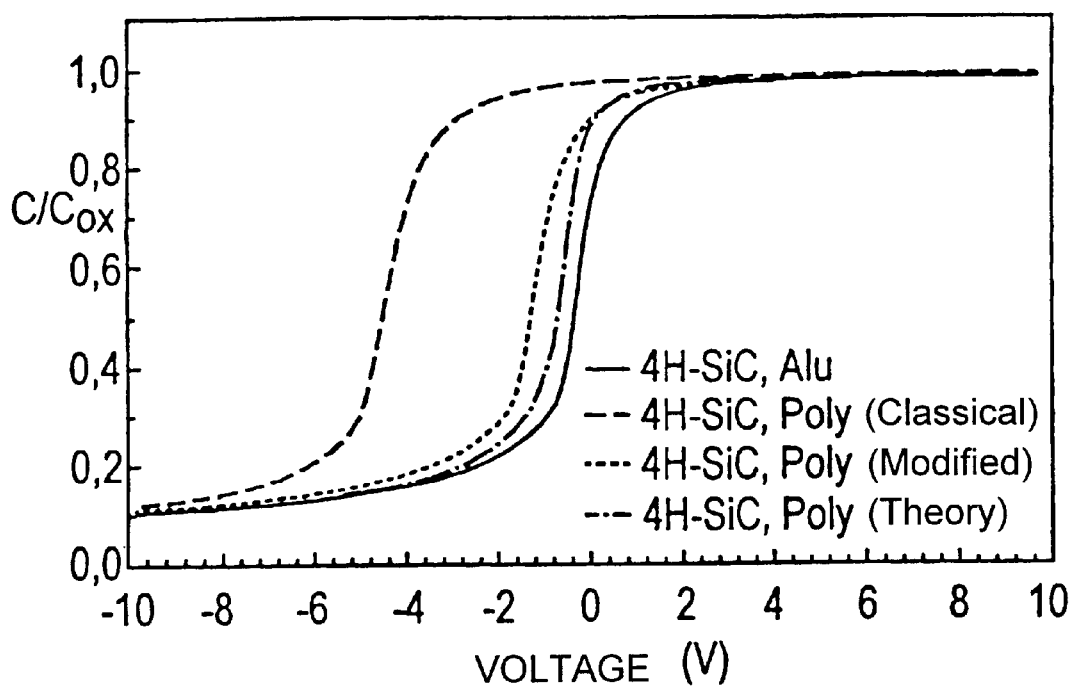

METHOD FOR MANUFACTURING A MIS STRUCTURE ON SILICON CARBIDE (SIC)

BACKGROUND OF THE INVENTION

The present invention generally relates to a method for manufacturing a MIS structure on silicon-carbide.

The basic element of a MOS field effect transistor (MOSFET) is the MOS structure composed of what is referred to as a gate electrode, an insulator and a semiconductor. Its electrical properties, which basically define the function and stability of the MOSFET, can be determined, for example, at correspondingly constructed MOS test structures by investigating the capacitance/voltage and current/voltage behavior. The density of locally fixed charges and the density of reloadable traps at the insulator-to-semiconductor boundary surface as well as the strength of the leakage currents flowing through the overall structure are determinant for the quality of the MOS structure. While stationary charges shift the cutoff voltage of a unipolar transistor, traps reduce the mobility of the charge carriers in the channel of the MOSFET. The leakage currents flowing through the MOS capacitor should optimally be small to prevent a charging of traps in the gate oxide and the accompanying degradation of the long-term stability as well as of the transistor characteristics.

The gate electrode of the MOSFET components is usually not fabricated of a metal but of highly doped polysilicon. This, in particular, may be technologically advantageous since self-aligning processes can be utilized in the manufacture of the MOSFETs, and high-temperature processes can be applied after the deposition of the gate material. On the other hand, polysilicon improves those electrical characteristics of the MOS structure that are dependent on the properties of the boundary surface formed by the gate electrode and the gate insulator. No significant degradation of the long-term stability thus arises even when the MOS structure is loaded with strong electrical fields. This is particularly significant for the use of the MOSFETs in the field of power and high-temperature electronics.

The n-channel MOSFET is generally known from J. W. Palmour et al., "High-temperature depletion-mode metal-oxide semiconductor field-effect transistors in beta-SiC thin films," *Appl. Phys. Lett.* 51, American Institute of Physics, Dec. 14, 1987, pp. 2028–2039, and J. W. Palmour et al., "Semiconductor field-effect transistors in β-SiC thin films," *Appl. Phys. Lett.* 54, American Institute of Physics, Aug. 15, 1988, pp. 2168–2177, wherein an annularly fashioned gate electrode of polycrystalline silicon that is approximately 500 nm thick and is separated from the SiC semiconductor by an $SiO_2$ insulator layer is taught. The methods deriving from and optimized in Si technology are employed in its manufacture. Thus, the gate material is deposited from the vapor phase with a chemical vapor deposition (CVD) process at a temperature of T>620° C. and is subsequently doped by drive-in of phosphorous in a very high concentration ($>10^{21} cm^{-3}$). The MOSFET, however, already conducts current given a gate voltage $U_G$=0 V (see J. W. Palmour et al. "High-temperature depletion-mode metal-oxide semiconductor field-effect transistors in beta-SiC thin films," *Appl. Phys. Lett.* 51, American Institute of Physics, Dec. 14, 1987, pp. 2028–2039, FIG. 2, p. 2029, wherein this behavior which is referred to as "normally on" cannot be attributed to the differently sized work functions of gate material and semiconductor.

The 6H—SiC MOSFET disclosed by J. N. Pan et al. in "Self-aligned 6H—SiC MOSFETs with improved current drive," *Electronics Letters*, Vol. 21, No. 14, July 1995, pp. 1200–1201, also does not switch into the inhibiting condition until the gate electrode lies at a negative potential. Like the above-recited transistor, it can, therefore, not be utilized in all areas of circuitry and power electronics where self-inhibiting ("normally off") MOS components are required.

As taught in W. Xie et al., "The effect of thermal processing on polycrystalline silicon/$SiO_2$/6H—SiC metal-oxide-semiconductor devices," *Appl. Phys. Lett.* 68, American Institute of Physics, Apr. 15, 1996, pp. 2231–2233, the influence of the process temperature on the creation of stationary charges was investigated during the manufacture of a poly-Si/$SiO_2$/6H—SiC component. As taught in this publication, the dopants are recommended to be driven into the gate material at a temperature T~850–900° C. to limit the effective density of stationary charges to values $Q_{tot} < 8 \cdot 9 \cdot 10^{11}$ $cm^{-2}$.

SUMMARY OF THE INVENTION

The present invention is directed to a method for manufacturing a MIS structure (conductor-insulator-semiconductor) on silicon carbide. The method produces noticeably fewer stationary charges arising at the insulator/SiC semiconductor boundary surface than given in an application of conventional manufacturing techniques.

To this end, in an embodiment of the present invention, a method for manufacturing a MIS structure on silicon carbide is provided comprising the steps of: providing a substrate composed of silicon carbide with a first layer composed of an electrically insulating material; applying an amorphous, second layer on the first layer wherein the second layer is composed of a semiconductor material; modifying the conductivity or the specific resistance of the semiconductor material of the second layer; and structuring the second layer.

In an embodiment, the steps of applying and modifying are simultaneously implemented.

In an embodiment, the second layer is applied at a temperature of T<580° C.

In an embodiment, the second layer is converted into the polycrystalline condition at a temperature of T≧850° C. wherein the converting is implemented simultaneously with the modifying step or after the modifying step.

In an embodiment, modifying the conductivity or the specific resistance of the semiconductor material is effected by introducing an element acting as an acceptor or a donor.

In an embodiment, the semiconductor material is deposited from the vapor phase.

In an embodiment, the second layer is composed of silicon.

By depositing the silicon serving as a gate material in amorphous form and subsequent doping, one succeeds in reducing the effective density of the boundary surface charges to less than one-tenth of the value of correspondingly constructed but conventionally manufactured MOSiC structures. This, for example, enables the manufacture of MOSFETs whose electrical properties are not influenced or only insignificantly influenced by the boundary surface charges. One thus observes no shift of its cutoff voltage toward negative values. The transistors inhibit given a gate voltage $U_G$=0 V. They thus exhibit the behavior referred to as "normally off" which may be required, in particular, in the field of circuitry and power electronics.

Additional features and advantages of the present invention are described in, and will be apparent from, the detailed description of the presently preferred embodiments and from the drawings.

BRIEF DESCRIPTION OF THE DRAWINGS

FIG. 2 illustrates a graph of the influence of the substrate and gate material on the capacitance/voltage behavior of MOS test structures.

FIG. 3 illustrates a graph of the operational sign and amount of boundary surface charges arising after implementation of individual method steps for the manufacture of a MOS test structure.

FIG. 4 illustrates a graph of the influence of the thickness of the gate oxide on the effective density $Q_{tot}$ of the boundary surface charges.

FIG. 5 illustrates a graph of the influence of the deposition temperature on the operational sign and effective density $Q_{tot}$ of the boundary surface charges.

FIG. 6 illustrates a graph of the capacitance/voltage behavior of MOS test structures dependent on the gate material and on the nature of the manufacturing method.

DETAILED DESCRIPTION OF THE PRESENTLY PREFERRED EMBODIMENTS

Figure 1:
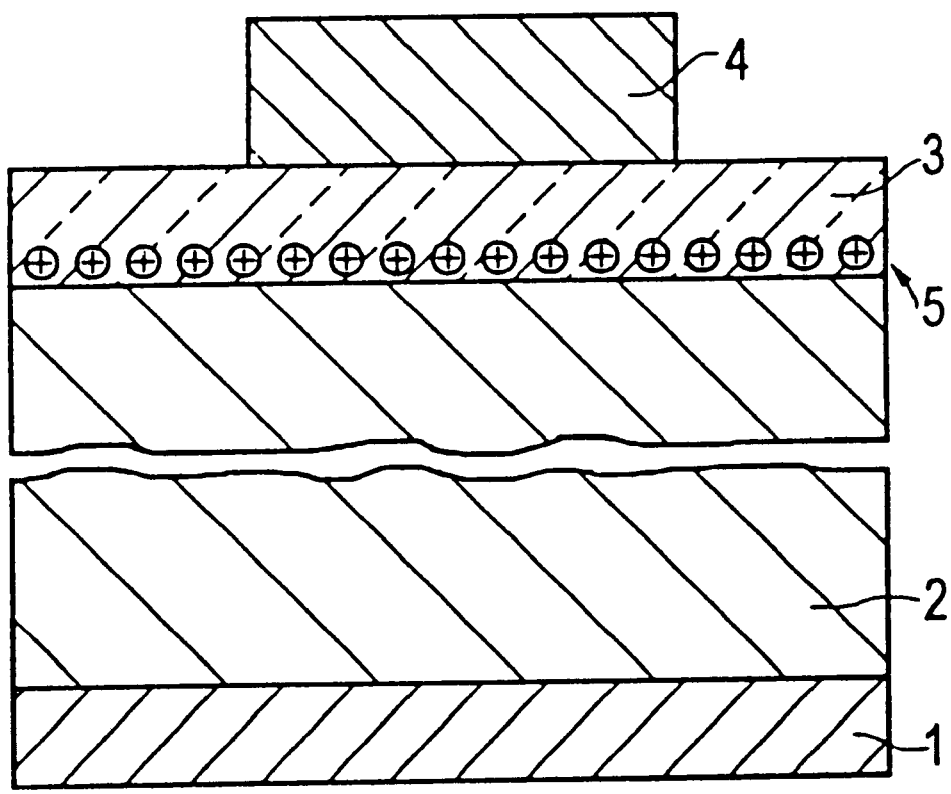
FIG. 1 illustrates a cross-sectional view of an embodiment of a MOS test structure.

A MOS capacitor as schematically shown in FIG. 1 serves as a test structure for measurements as described below. The MOS capacitor is essentially composed of a metallic back side contact 1, an n-doped SiC semiconductor substrate 2 (4H or 6H modification), an $SiO_2$ insulator layer 3 and an electrode 4 (gate or control electrode) made of polycrystalline silicon. Using methods generally known from silicon technology, a gate material is deposited from the vapor phase at a temperature of T=620° C. and a pressure of p=250 mTorr and subsequently doped by drive-in of phosphorous. For example, see J. W. Palmour et al. "Semiconductor field-effect transistors in β-SiC thin films," *Appl. Phys. Lett.* 54, American Institute of Physics, Aug. 15, 1988, pages 2171–2172. During these process steps, positive boundary surface charges 5 whose effective density $Q_{tot}$ reach extremely high values are formed in the oxide (as shown in the right-hand part of FIG. 2). By comparison thereto, significantly smaller amounts of the effective charge densities $Q_{tot}$ were measured in correspondingly constructed MOS test structures equipped with Al electrodes. The left-hand part of FIG. 2 shows the capacitance/voltage behavior of the MOS test structures. The normed capacitance $C/C_{ox}$ ($C_{ox}$=capacitance of the oxide) is respectively shown dependent on the gate voltage.

The extent to which the individual process steps (generating the gate oxide/depositing the poly-crystalline silicon/drive-in of phosphorous) that contributes to the build-up of the positive boundary surface charges is generally illustrated with reference to FIG. 3. As shown in FIG. 3, only about 15% of the charges arise during a deposition process wherein a great majority (~85%) arise during the doping.

FIG. 4 shows the influence of the thickness $d_{ox}$ of the gate oxide on the effective density $Q_{tot}$. As shown in FIG. 4, nearly the same effective density $Q_{tot}$ of positive boundary surface charges is measured in MOS test structures (4H—SiC) with 40 nm or, respectively, 56 nm thick oxide layers 3. Only a reduction of the insulator thickness to about 20 nm results in a noteworthy reduction of the effective charge density $Q_{tot}$. These measured results confirm that nearly all charges are localized in the region of the insulator 3 and semiconductor 2 boundary surface.

As shown with reference to FIG. 5, the deposition temperature for the silicon serving as a gate material has, by far, the greatest influence on the effective density $Q_{tot}$ of the boundary surface charges. Independently of the thickness $d_{ox}$ of the gate oxide, thus, negative boundary surface charges with an effective density $Q_{tot}<1-2\times10^{11}$ cm$^{-2}$ always arose when the deposition temperature is lowered from T=620° C. to probably 450° C.$\leq$T$\leq$580° C., and most preferably T=560° C., and the doping with phosphorous is undertaken in a known way.

The occurrence of extremely high positive charge densities $Q_{tot}$ in the gate oxide 3 is presumably based on the effect of mechanical stresses in the gate material. The silicon deposited at a temperature T=620° C. is polycrystalline with extremely small, column-shaped crystalline regions. The crystalline regions grow during the doping (drive-in of phosphorous at T>900° C.), wherein the grain boundaries that already exist impede this process and, consequently, great mechanical stresses build up in the MOS structure. When, by contrast, the deposited silicon has an amorphous structure (deposition temperature T<580° C.), the crystal growth proceeds comparatively unimpeded and free of mechanical stresses. The formation of comparatively large crystalline regions thus occurs in the deposited layer as deposited in the method of the present invention. Moreover, the roughness of the boundary surface is noticeably reduced compared to the conventionally generated structures. As observed in MOS structures on Si substrates, this has an advantageous effect on the properties of the MOS structure that are relevant for the transistor.

FIG. 6 shows that a MOS test structure produced by an embodiment of the method of the present invention exhibits approximately the capacitance/voltage behavior anticipated according to MOS theory. The normed capacitance $C/C_{ox}$ is again shown, whereby the dot-dash curve represents the curve anticipated according to MOS theory, and the dotted curve represents the capacitance relationships $C/C_{ox}$ measured at a 4H-MOS test structure manufactured according to a method of the present invention. The corresponding measured values for the 4H-MOS test structure equipped with an aluminum gate (solid curve) and for a 4H-MOS test structure equipped with polysilicon as a gate material manufactured upon application of the known deposition process (broken-line curve) are also shown.

Figure 7A:
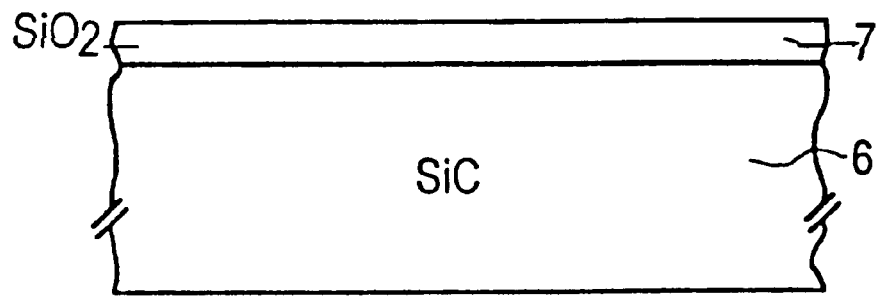
FIGS. 7(a)–7(c) illustrate a SiC substrate after implementation of individual steps of an embodiment of the method.
Figure 7B:
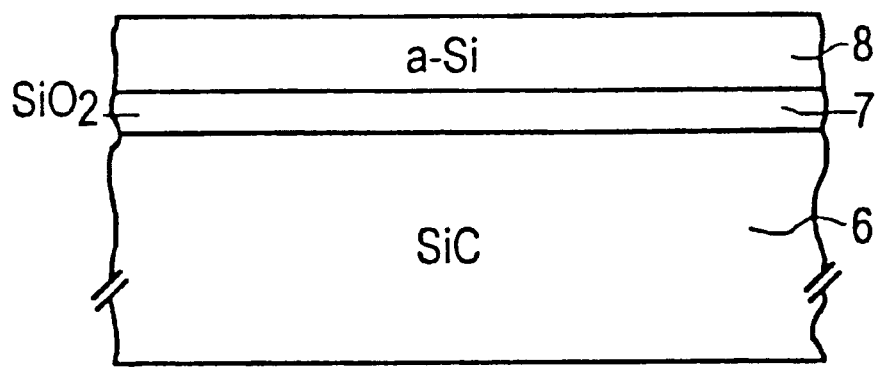
Figure 7C:
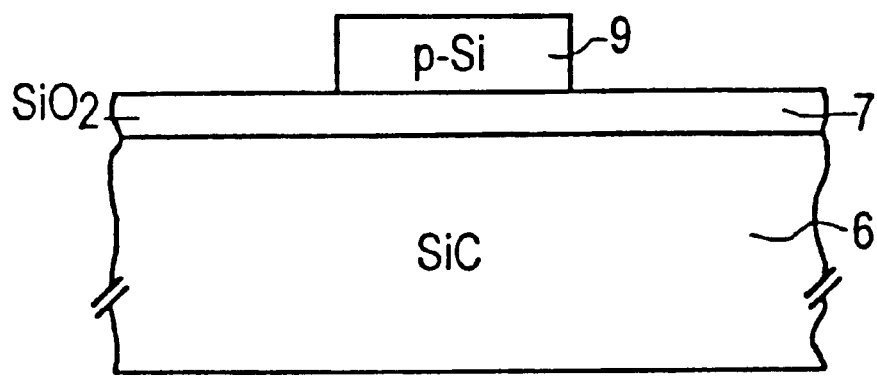

The point of departure of the method of the present invention for manufacturing a MOS structure is a SiC substrate 6 provided with an approximately 5–500 nm thick $SiO_2$ insulator layer 7 on whose surface an approximately 0.01–1 μm thick layer 8 of amorphous silicon is deposited (see FIGS. 7(a) and 7(b)). The coating proceeds by thermal decomposition of a gas mixture containing, for example, silane ($SiH_4$) in the chamber of a CVD reactor at a pressure of, for example, p=250 mTorr and a temperature of T<580° C., and preferably at a temperature of T=560° C. Subsequently, the amorphous silicon is doped with phosphorous in a very high concentration ($N_p>10^{21}$ cm$^{-3}$) wherein, in particular, the diffusion methods described in J. W. Palmour et al. "Semiconductor field-effect transistors in β-SiC thin films," *Appl. Phys. Lett.* 54, American Institute of Physics, Aug. 15, 1988, pp. 2168–2177 or W. Xie et al., "The effect of thermal processing on polycrystalline silicon/$SiO_2$/6H—SiC metal-oxide-semiconductor devices," *Appl. Phys. Lett.* 68, American Institute of Physics, Apr. 15, 1996, pp. 2231–2233 can be employed. Since the temperature lies above T>600° C. during this process, the structure of the silicon layer 8 transforms from amorphous to polycrystalline. The doping is followed by the photolithographic structuring of the polycrystalline silicon layer 8 to produce the gate electrode (see FIG. 7(c)).

The present invention, of course, is not limited to the above-described exemplary embodiment. Thus, for example, the amorphous silicon layer can also be deposited in the chamber of a high-frequency glow discharge reactor with the assistance of the PECVD (Plasma Enhanced Chemical Vapor Deposition) method at a temperature lying in the range of 150° C.<T<300° C., being deposited on, for example, the $SiO_2$, $Al_2O_3$ or $Si_3N_4$ insulator layer 7 of the SiC substrate 2 (4H or 6H modification or some other poly-type), and doping can be subsequently implemented in the above-described way with an element acting as donor or acceptor. When the doping is to proceed during the growth of the amorphous Si layer 8, the corresponding doping gas (for example, phosphine $PH_3$) is added to the carrier gas. Since the following tempering, which serves for the activation of the dopant, occurs at a temperature of T>850° C., the silicon layer 8 is transformed from the amorphous into the polycrystalline condition. When other doping techniques (ion implantation) and methods for producing an adequately high electrical conductivity are employed, the amorphous structure of the Si layer 8 is potentially preserved.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. A method for manufacturing a MIS structure on silicon carbide, the method comprising the steps of:

providing a substrate composed of silicon carbide with a first layer composed of an electrically insulating material;

applying an amorphous, second layer on the first layer, wherein the second layer is composed of a semiconductor material;

modifying the conductivity or the specific resistance of the semiconductor material of the second layer, said modifying step includes doping the second layer; and structuring the second layer subsequent to said modifying step.

2. The method according to claim 1 wherein the steps of applying and modifying are simultaneously implemented.

3. The method according to claim 1 wherein the second layer is applied at a temperature of T<580° C.

4. The method according to claim 1 further comprising the step of:

converting the second layer into the polycrystalline condition at a temperature T>850° C. wherein the converting step is implemented simultaneously with the modifying step or after the modifying step.

5. The method according to claim 1 wherein modifying the step of the conductivity or the specific resistance of the semiconductor material is effected by introducing an element acting as an acceptor or a donor.

6. The method according to claim 1 wherein the semiconductor material is deposited from the vapor phase.

7. The method according to claim 1 wherein the second layer is composed of silicon.

* * * * *